(12) United States Patent
Chuang

(10) Patent No.: US 8,536,607 B2
(45) Date of Patent: Sep. 17, 2013

(54) MANUFACTURING METHOD OF LED BASE PLATE, LED BASE PLATE AND WHITE LIGHT LED STRUCTURE

(76) Inventor: Yu-Feng Chuang, Taoyuan County (TW)

(*) Notice: Subject to any disclaimer, the term of this patent is extended or adjusted under 35 U.S.C. 154(b) by 39 days.

(21) Appl. No.: 13/396,653

(22) Filed: Feb. 15, 2012

(65) Prior Publication Data
US 2012/0313127 A1    Dec. 13, 2012

(30) Foreign Application Priority Data
Jun. 9, 2011   (TW) .............................. 100120074 A

(51) Int. Cl.
*H01L 33/48*   (2010.01)
(52) U.S. Cl.
USPC ............................................ 257/98; 438/141
(58) Field of Classification Search
USPC ................... 257/E33.068, 288, 292; 29/829; 438/91, 141
See application file for complete search history.

(56) References Cited

U.S. PATENT DOCUMENTS

| | | | |
|---|---|---|---|
| 7,621,654 B2* | 11/2009 | Nishimoto et al. | 362/241 |
| 8,063,868 B2* | 11/2011 | Sugitani et al. | 345/102 |
| 2003/0086030 A1* | 5/2003 | Taniguchi et al. | 349/61 |
| 2008/0029833 A1* | 2/2008 | Li | 257/410 |
| 2008/0049399 A1* | 2/2008 | Lu et al. | 361/714 |
| 2009/0256993 A1* | 10/2009 | Oku | 349/61 |
| 2011/0021965 A1* | 1/2011 | Karp et al. | 602/54 |
| 2011/0221999 A1* | 9/2011 | Shiau et al. | 349/62 |

* cited by examiner

*Primary Examiner* — Thao Le
(74) *Attorney, Agent, or Firm* — Rosenberg, Klein & Lee

(57) ABSTRACT

An LED base plate enabling the LED to emit high luminance white light. The base plate has a reflective surface, and protrusions disposed on the reflective surface have top portions formed with curved surfaces. The protrusions have bottom widths of 2 to 4 micrometers and heights of 1.2 to 1.8 micrometers, with adjacent protrusions having spaces of 0.6 to 3 micrometers. An InGaN epitaxy layer is coated on the reflective surface of the base plate and emits ultraviolet of wavelength in the range of 380 to 410 nanometer when the InGaN epitaxy layer is electrified. Ultraviolet light reflected by the reflective surface of the base plate and the protrusions stimulates and mixes fluorescent compounds of zinc oxide and yttrium aluminum garnet to generate complementary light of ultraviolet light. High luminance white light scatteringly emitted is used for illumination.

16 Claims, 9 Drawing Sheets

MANUFACTURING METHOD OF LED BASE PLATE, LED BASE PLATE AND WHITE LIGHT LED STRUCTURE

BACKGROUND OF THE INVENTION

1. Field of the Invention

The present invention relates to a manufacturing method of LED base plate, a LED base plate and a white light LED structure, and in particular relates to a LED base plate providing protrusions with optimized dimension and shape and utilizing ultraviolet light with specific wavelength to scatteringly emit high-brightness white light with an excellent color rendering index.

2. Description of the Related Art

In 1993, Shuji Nakamura, an employee of Nichia Corporation in Japan, applied wide band gap (WGB) semiconductor materials (e.g., GaN and InGaN) to develop blue light LEDs. By incorporating the blue light LEDs with the early-developed red LEDs and green LEDs, various of color light LEDs can be obtained by blending three primary colors, red, green and blue, and in particular white light LEDs can be used for illumination and lighting, to thus cause the rapid development of the LED illumination industries. Taiwan Patent Publication No. 200840096, "METHOD OF PRODUCING GROUP-III NITRIDE SEMICONDUCTOR LAYER, GROUP-III NITRIDE SEMICONDUCTOR LIGHT-EMITTING DEVICE AND LAMP THEREOF", discloses the skills to enhance the brightness of the LEDs. In '096 case, a method for manufacturing high crystallization group-III nitride semiconductor layer is utilized to provide a production method that enables production of a group-III nitride semiconductor layer having excellent crystallinity which can be used preferably for forming a light-emitting device having excellent internal quantum efficiency and light extraction efficiency. According to '096 case, the production method is a method of producing a group-III nitride semiconductor layer wherein a monocrystal group-III nitride semiconductor is formed on a substrate, the method including: a substrate-processing step where a plurality of projected parts which include a surface which is not parallel to a c-plane of the substrate are formed on the c-plane whereby a top surface which includes a flat surface formed of the c-plane and the projected part are formed on the substrate; and an epi-step where the group-III nitride semiconductor layer is formed on the top surface by epitaxial growth whereby the projected parts are covered with the group-III nitride semiconductor layer. However, the irregular reflection effect of the light on the above-described substrate is determined by the shape and dimension of the projected parts, and the result thereof depends on the brightness of the light scattered from the packaged resin. Herewith, many researchers are devoted themselves on how to optimize the shape and dimension of the projected parts.

Furthermore, Nichia Corporation provides white light LEDs by coating a layer of YAG fluorescent compound on InGaN blue light dies, wherein a yellow light of wavelength 555 nm complementary to the blue light can be generated when utilizing the blue light of wavelength 460 nm to radiate the YAG fluorescent compound, and then a white light can be generated when mixing the yellow light and blue light which are complementary, but the color rendering index of InGaN blue light dies coated with YAG fluorescent compound is not perfect. Accordingly, InGaN ultraviolet light with preferred color rendering index is utilized to generate white light LEDs, but the package layer made of epoxy resin is deteriorated when the package layer is radiated by the very short-wavelength ultraviolet light. Therefore, it is understood that the life span of the white light LED incorporated with ultraviolet light is determined by the selection of the fluorescent compound with respect to the ultraviolet light wavelength.

BRIEF SUMMARY OF THE INVENTION

In view of this, one purpose of the present invention is to improve the projected parts in the above-described arts with an optimized shape and dimension, thereby providing a white light LED structure to generate high-brightness white light.

Another purpose of the present invention is to excite a fluorescent compound to generate complementary color light of the ultraviolet light by specific wavelength of ultraviolet light, and a white light with an excellent color rendering index is generated after the ultraviolet light is blended with the complementary color light thereof, thereby reducing deterioration of the package layer made of epoxy resin and increasing the life span of the white light LED.

According to the purpose and constant researches and developments, the present invention provides a method for manufacturing a light-emitting diode (LED) base plate. The base plate includes a reflective surface. The method for manufacturing the LED base plate comprises the steps of: forming a plurality of protrusions on the LED base plate; and forming top portions of the protrusions with curved surfaces, so that the protrusions have bottom widths of 2 to 4 micrometers and heights of 1.2 to 1.8 micrometers, and the adjacent protrusions have spaces of 0.6 to 3 micrometers.

The protrusions are formed on the LED base plate by etching.

At least one bent segment is formed on an outer surface of the protrusion by laser engraving.

Another purpose of the present invention is to provide a light-emitting diode base plate, including a reflective surface and a plurality of protrusions disposed on the reflective surface. The protrusions have top portions formed with curved surfaces. The protrusions have bottom widths of 2 to 4 micrometers and heights of 1.2 to 1.8 micrometers, and the adjacent protrusions have spaces of 0.6 to 3 micrometers.

The protrusion is formed as one of conical shape, pyramidal shape or hemispherical shape.

The protrusion has an outer surfaces formed with at least one bent segment.

The LED base plate is made of sapphire.

Still another purpose of the present invention is to provide a white light LED structure. The white light LED structure comprises an epitaxial chip, a conductor, a fluorescent compound and a package body. The epitaxial chip comprises a base plate and an InGaN epitaxy layer, the base plate including a reflective surface and a plurality of protrusions disposed on the reflective surface, wherein the InGaN epitaxy layer is coated on the reflective surface of the base plate, and the protrusions have top portions formed with curved surfaces, so that the protrusions have bottom widths of 2 to 4 micrometers and heights of 1.2 to 1.8 micrometers, the adjacent protrusions have spaces of 0.6 to 3 micrometers, and the InGaN epitaxy layer coated on the reflective surface of the base plate emits ultraviolet of wavelength in the range of 380 to 410 nanometer when the InGaN epitaxy layer is electrified. The conductor comprises two lead wire bases respectively disposed with a lead wire. The epitaxial chip is bonded on either of the two lead wire bases of the conductor, and the two lead wires are connected to the InGaN epitaxy layer of the epitaxial chip. The fluorescent compound covering on the InGaN epitaxy layer of the epitaxial chip at least comprises zinc oxide and yttrium aluminum garnet. The package body is utilized to package the epitaxial chip, the conductor and the fluorescent compound. The two lead wire bases of the conductor are penetrated through and disposed out of the package body.

With the protrusion of the base plate disposed in the white light LED, irregular reflection of the ultraviolet light in the InGaN epitaxy layer and illumination efficiency can be enhanced, and deterioration of the package body (epoxy resin) can be reduced and the life span thereof can be increased by the ultraviolet light of wavelength in the range of 380 to 410 nanometer. Further, because the fluorescent compound is excited to generate complementary color light of the ultraviolet light and a white light with an excellent color rendering index is generated after the ultraviolet light is blended with the complementary color light thereof, it is understood that the white light LED structure of the present invention is more suitable for illumination facilities.

The protrusions of the base plate is formed as one of conical shape, pyramidal shape or hemispherical shape.

With at least one bent segment formed on an outer surface of the protrusion, irregular reflection of the ultraviolet light in the InGaN epitaxy layer can be again enhanced, so that light extraction efficiency can be further increased.

Further, in the fluorescent compound, weight percentage of the zinc oxide in the fluorescent compound is 5% to 15%. Because the zinc oxide is belong to II-VI semiconductor material with a band gap of 3.3 electron volt and with the same degree as the large energy gap semiconductor containing gallium nitride (GaN), silicon carbide (SiC) or zinc selenide (ZnSe), the fluorescent compound mixed with 5% to 15% of weight percentage of the zinc oxide can be utilized to activate yttrium aluminum garnet (YAG), so that an enhanced high-intensity complementary color light of the ultraviolet light can be obtained by exciting YAG in the operation process.

Further, the fluorescent compound can be deposited on the InGaN epitaxy layer of the epitaxial chip, thereby obtaining high-purity zinc oxide and yttrium aluminum garnet and controlling the thickness of the fluorescent compound with great precision. In operation process, because the fluorescent compound is directly deposited on the InGaN epitaxy layer of the epitaxial chip, the ultraviolet light is singly and outwardly emitted from the package body without leakage.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
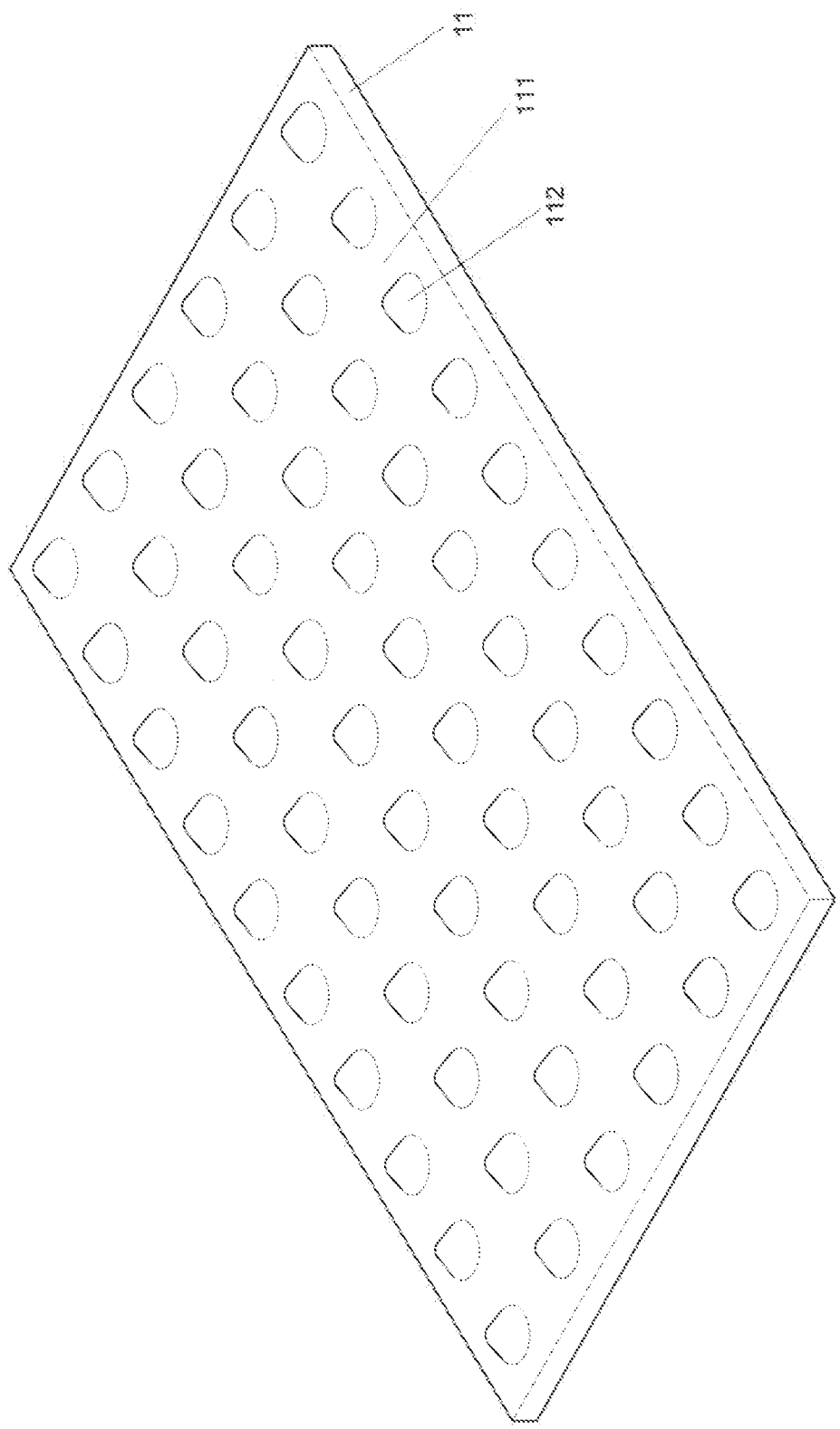
FIG. 1 is a schematic view of a base plate of an epitaxial chip of the present invention, wherein the base plate is formed with protrusions.
Figure 2:
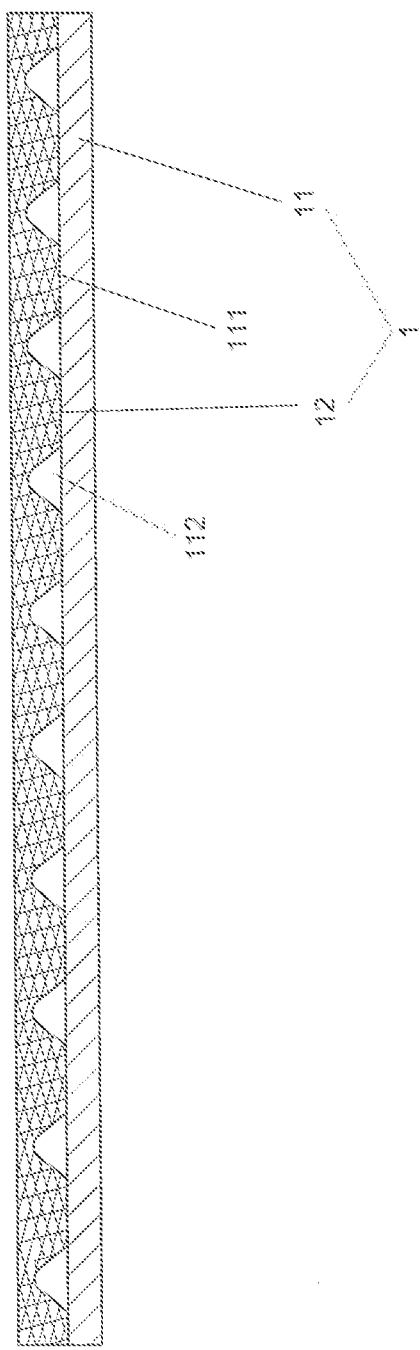
FIG. 2 is a schematic view of an epitaxial chip of the present invention.
Figure 3:
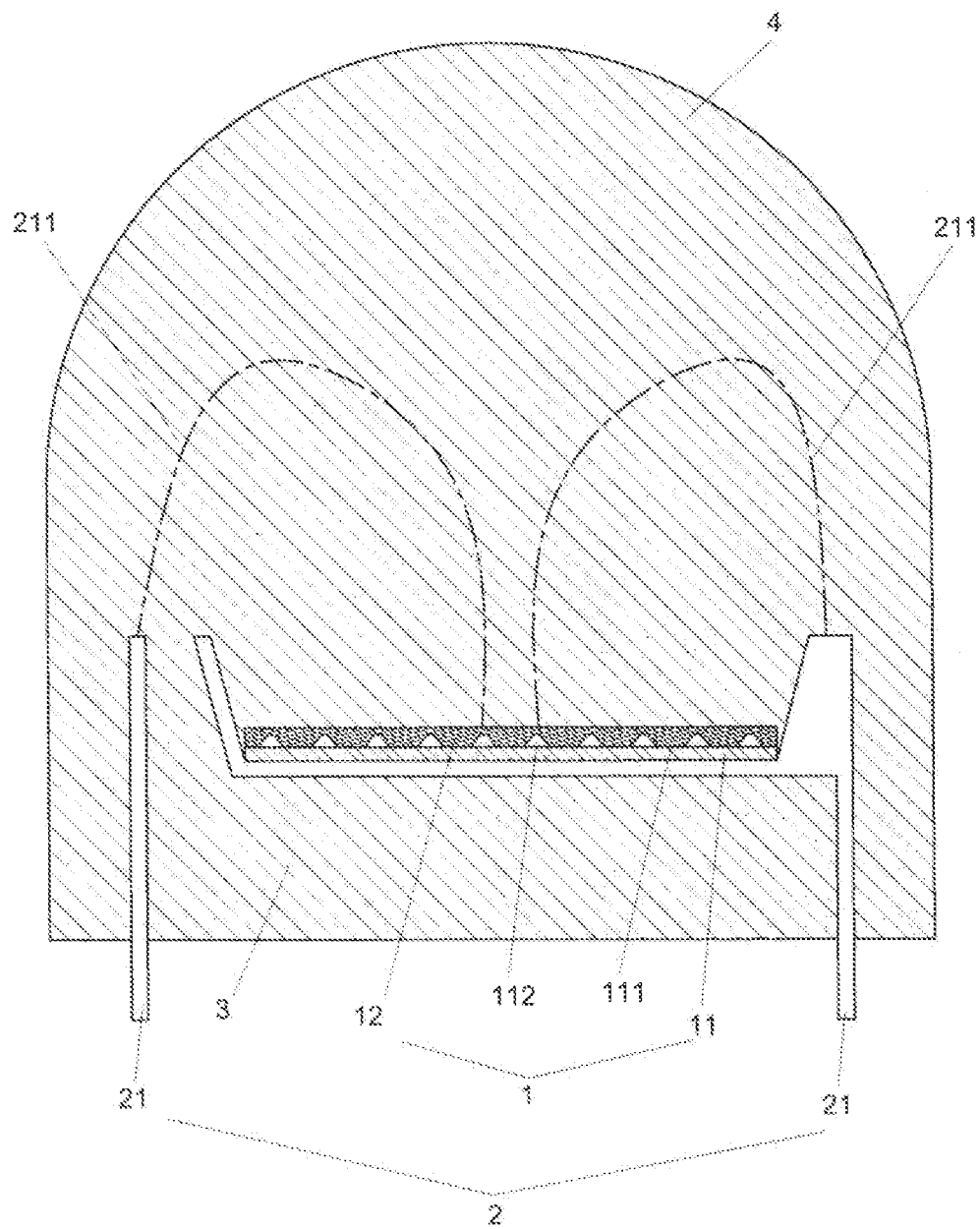
FIG. 3 is a schematic view of a white light light-emitting diode (LED) structure the present invention, wherein the white light LED structure is constructed by mixing a fluorescent compound into a package body.

According to the above-described technical features, a preferred embodiment of the present invention is illustrated in FIGS. 1 to 3. Taking a white light light-emitting diode (LED) structure for example, the white light LED structure comprises an epitaxial chip 1, a conductor 2, a fluorescent compound 3 and a package body 4.

The epitaxial chip 1 comprises a base plate 11 and an InGaN epitaxy layer 12, wherein the base plate 11 includes a reflective surface 111 disposed with a plurality of protrusions 112 thereon. The protrusion 112 is formed as one of conical shape, pyramidal shape or hemispherical shape. The base plate 11 of the epitaxial chip 1 is made of sapphire. Instead of the traditional silicon substrate, the sapphire is a crystal of aluminum dioxide ($Al_2O_3$) providing perfect lattice constants to match GaN or InGaN. Further, because the well-developed semiconductor etching techniques can provide excellent isotropic etching effect and a transferred mask pattern on the base plate 11, it is simple to form the protrusions 112 on a semiconductor by etching methods. The top portions of the protrusions 112 are formed with curved surfaces, and the protrusions 112 have bottom widths of 2 to 4 micrometers and heights of 1.2 to 1.8 micrometers, the adjacent protrusions 112 have spaces of 0.6 to 3 micrometers. In this embodiment, the protrusions 112 are formed as similar conical shape, which are measured in accordance with the following dimensional conditions: the bottom width of the protrusion 112 formed on the base plate 11 is 2.4 micrometers, the heights of the protrusion 112 formed on the base plate 11 is 1.5 to 1.8 micrometers, and the space of between the adjacent protrusions 112 formed on the base plate 11 is 0.6 micrometer. In addition, the InGaN epitaxy layer 12 is coated on the reflective surface 111 of the base plate 11, and the InGaN epitaxy layer 12 coated on the reflective surface 111 of the base plate 11 emits ultraviolet light of wavelength in the range of 380 to 410 nanometer when the InGaN epitaxy layer 12 is electrified. In operation, with the protrusion 112 formed on the base plate 11, irregular reflection of the ultraviolet light in the InGaN epitaxy layer 12 can be enhanced, thereby increasing illumination brightness and optimizing color rendering index of the illumination facilities. The package body 4 is made of epoxy resin. Meanwhile, the deterioration of the package body 4 (epoxy resin) can be reduced by the ultraviolet light of wavelength in the range of 380 to 410 nanometer, thereby increasing the life span of the package body 4.

The conductor 2 comprises two lead wire bases 21 respectively disposed with a lead wire. The epitaxial chip 1 is bonded on either of the two lead wire bases 21 of the conductor 2, and the two lead wires are connected to the InGaN epitaxy layer 12 of the epitaxial chip 1, thereby conducting the current to the InGaN epitaxy layer 12 of the epitaxial chip 1.

The fluorescent compound 3 is utilized to cover on the InGaN epitaxy layer 12 of the epitaxial chip 1. The fluorescent compound 3 at least comprises zinc oxide and yttrium aluminum garnet, wherein weight percentage of the zinc oxide in the fluorescent compound 3 is 5% to 15%. Because the zinc oxide is belong to II-VI semiconductor material with a band gap of 3.3 electron volt and with the same degree as the large energy gap semiconductor containing gallium nitride (GaN), silicon carbide (SiC) or zinc selenide (ZnSe), the fluorescent compound 3 mixed with 5% to 15% of weight percentage of the zinc oxide can be utilized to activate yttrium aluminum garnet (YAG), so that an enhanced high-intensity complementary color light of the ultraviolet light can be obtained by YAG in the operation process.

Figure 4:
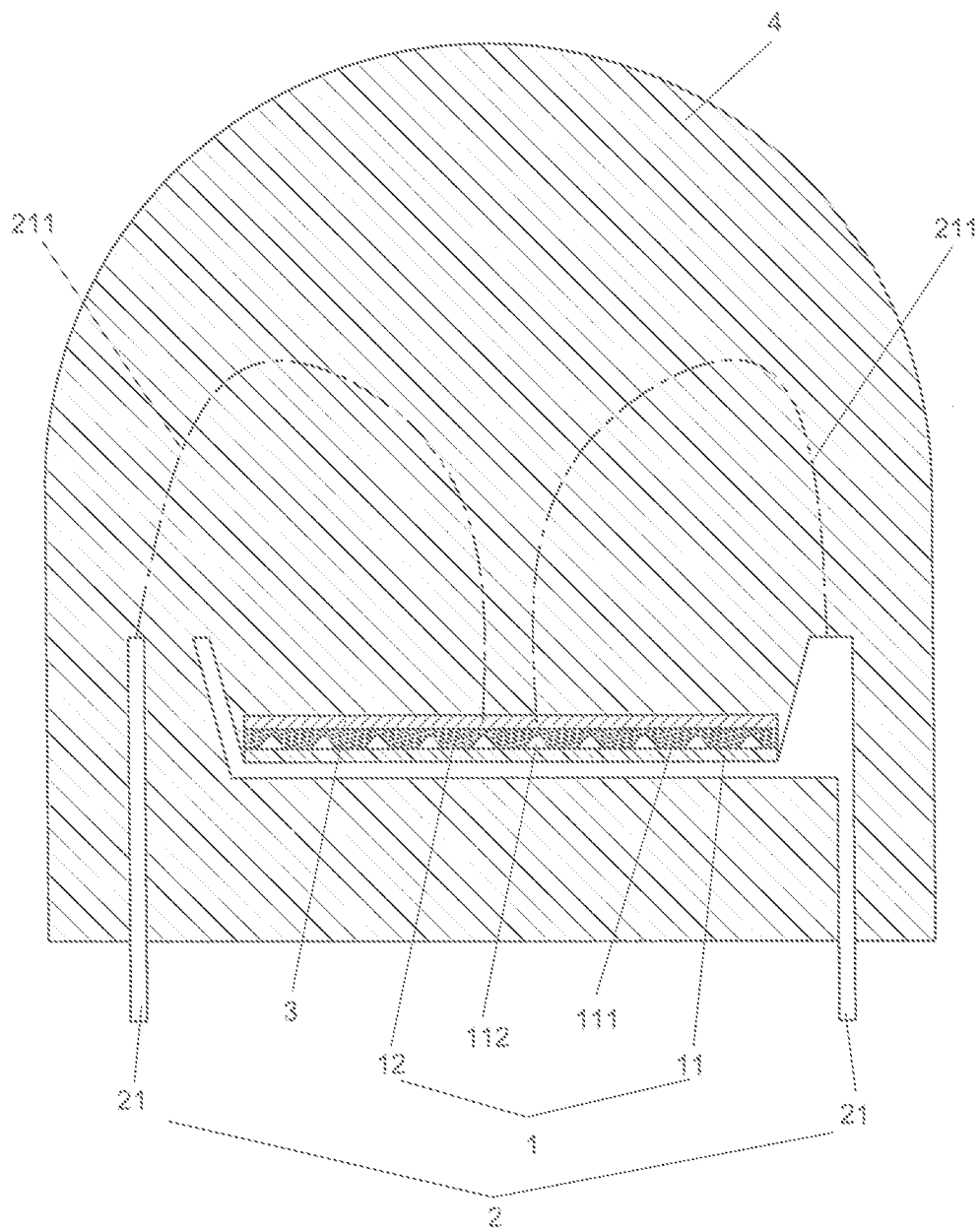
FIG. 4 is a schematic view of a white light LED structure the present invention, wherein the white light LED structure is constructed by coating a fluorescent compound on a InGaN epitaxy layer.

The package body 4 made of epoxy resin is utilized to package the epitaxial chip 1, the conductor 2 and the fluorescent compound 3. The two lead wire bases 21 of the conductor 2 is penetrated through and disposed out of the package body 4 to form conductive pins. The structure formed by this package process can be used for the subsequent assembling processes of the illumination facilities. The fluorescent compound 3 can be mixed in the package body 4, thereby simplifying the manufacturing process and reducing the manufacturing cost. It is noted that the fluorescent compound 3 is not limited to the above-described method. Referring to FIG. 4, the fluorescent compound 3 can be deposited on the InGaN epitaxy layer 12 of the epitaxial chip 1, thereby obtaining high-purity zinc oxide and yttrium aluminum garnet and controlling the thickness of the fluorescent compound 3 with great precision. In operation process, because the fluorescent compound 3 is directly deposited on the InGaN epitaxy layer 12 of the epitaxial chip 1, the ultraviolet light is singly and outwardly emitted from the package body 4 without leakage.

Figure 5:
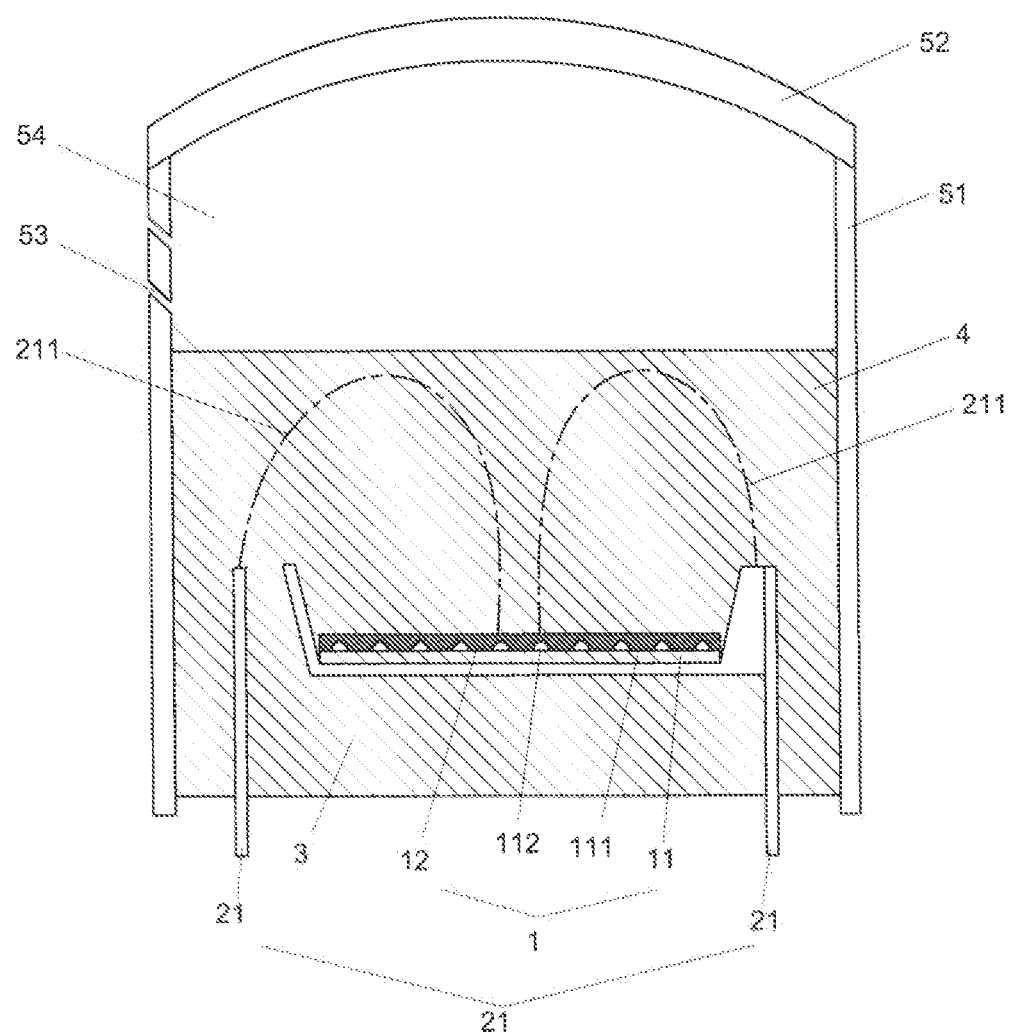
FIG. 5 is another schematic view showing the structure of the white light LED structure of the present invention.

Further, the white light LED structure of the present invention is not limited to the above-described packaging method. Referring to FIG. 5, the epitaxial chip 1 is bonded on the lead wire base 21 of the conductor 2. When the epitaxial chip 1, the conductor 2 and the fluorescent compound 3 are packaged by the package body 4, the package body 4 is disposed on one distal end of an barrel-like accommodation element 51 and the other distal end of the barrel-like accommodation element 51 is sealed by a light transmissive mask 52. When the InGaN epitaxy layer 12 is electrified, the electric current urges the InGaN epitaxy layer 12 to emit ultraviolet light of 380 to 410 nm wavelength, the irregular reflection of the ultraviolet light in the InGaN epitaxy layer 12 is increased by the protrusion 112 formed on the base plate 11 to enhance illumination brightness and color rendering index, and the emitted ultraviolet light is reflected from the reflective surface 111 of the epitaxial chip 1 so that a complementary color light is generated by the fluorescent compound 3 located in the package body 4 to be outwardly scattered through the light transmissive mask 52.

In view of the problems of the conventional white light LEDs, such as hard to dissipated heat flux generated in the illuminating process, the present invention provides a metallic barrel-like accommodation element 51 formed with an accommodation space 54 to exhaust heat flux, thereby avoiding the thermal degradation of the package body 4 and increasing the life span. A heat-dissipative hole 53 is disposed on or surroundingly formed on a side surface of the barrel-like accommodation element 51, or is preferably to outwardly deploy as a radiated arrangement in accordance with the illuminating direction of the LED.

The light transmissive mask 52, made of light transmissive material such as resin, glass or plastic, is preferably disposed with a camber or optimistically disposed with a bent segment to outwardly scatter the light.

Table 1 shows the die testing value of an unpackaged epitaxial chip after the epitaxial process, on the condition that the base plate is a flat plate. Table 2 shows the die testing value of an unpackaged epitaxial chip 1 after the epitaxial process, on the condition that the base plate 1 is disposed with the protrusions 112.

TABLE 1

| Test Item | VF | IR | WP | Φe |
|---|---|---|---|---|
| Conditions | 20.0 mA | 5.0 V | 20.0 mA | 20.0 mA |
| Low limit | 3.0 | | 360.0 | 0.0 |
| Hi limit | 4.2 | 1.0 | 430.0 | 200.0 |
| Success % | 99.44 | 97.18 | 98.87 | 98.87 |
| Avg | 3.57 | 0.03 | 389.5 | 4.326 |
| Std | 0.03 | 0.03 | 1.3 | 0.776 |

TABLE 2

| Test Item | VF | IR | WP | Φe |
|---|---|---|---|---|
| Conditions | 20.0 mA | 5.0 V | 20.0 mA | 20.0 mA |
| Low limit | 3.0 | | 360.0 | 0.0 |
| Hi limit | 4.2 | 1.0 | 430.0 | 200.0 |
| Success % | 96.00 | 94.29 | 96.00 | 96.00 |
| Avg | 3.61 | 0.04 | 391.5 | 6.99 |
| Std | 0.04 | 0.08 | 1.2 | 1.697 |

In Tables 1 and 2, "VF" is represented for forward bias voltage, "IR" is represented for reverse current, "WP" is represented for peak wavelength, and "Φe" is represented for light quantity. Based on the same values of "VF" (forward bias voltage), "IR" (reverse current) and "WP" (peak wavelength) in Tables 1 and 2, it is understood that light quantity "Φe" of the base plate 11 of the present invention has about 62% greater than that of the flat base plate. In comparison with the above-described Taiwan Patent Publication No. 200840096, "METHOD OF PRODUCING GROUP-III NITRIDE SEMICONDUCTOR LAYER. GROUP-III NITRIDE SEMICONDUCTOR LIGHT-EMITTING DEVICE AND LAMP THEREOF", and Table 6 in the detailed description of embodiment thereof, the protrusions of '096 case can only increase about 20% in brightness, and '096 case can totally increase about 40% in brightness.

Referring to FIG. 5, when an initial 2" sapphire wafer is disposed with the protrusions 112 and the InGaN epitaxy layer 12 thereon is epitaxied, the 2" sapphire wafer can be approximately cut into ten thousand pieces of 13 mil epitaxial chips 1. According to FIG. 3 and statistic data, it is understood that the epitaxial chips 1 of the present invention has about 71% radiation flux Po increased greater than that of the epitaxial chip without the protrusions, thereby increasing the brightness of the white light LED.

Figure 6:
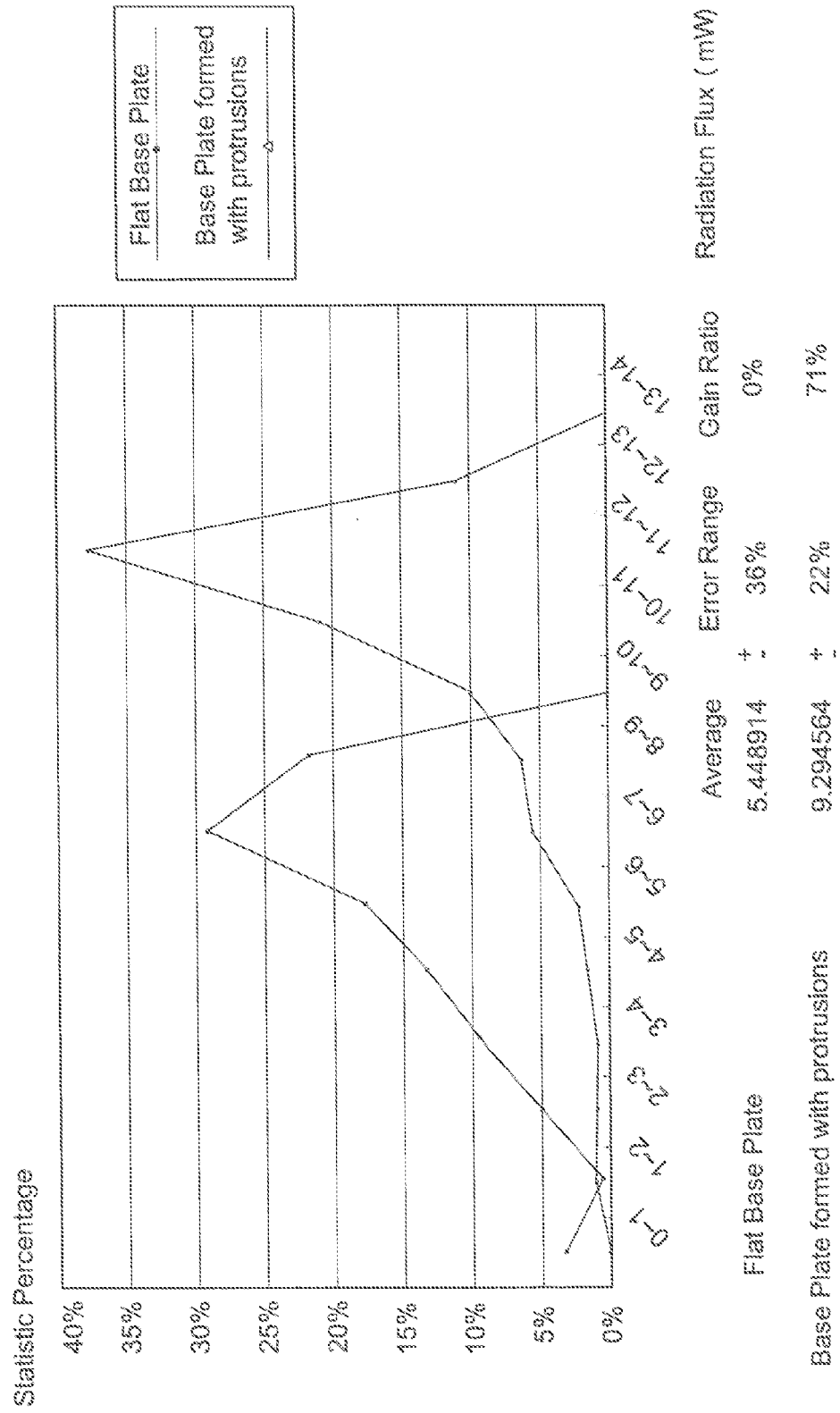
FIG. 6 is a schematic statistic diagram showing gain comparison of the radiation flux (Po) of a 13 mil epitaxial chip cut from a 2" sapphire wafer of the present invention.

Referring to Table 3 and FIG. 6 simultaneously, FIG. 6 shows that when an initial 2" sapphire wafer is disposed with the protrusions 112 and the in GaN epitaxy layer 12 disposed thereon is epitaxied, the 2" sapphire wafer can be approximately cut into one thousand pieces of 40 mil epitaxial chips 1, and Table 3 shows the values of the radiation fluxes Po compared between the epitaxial chip 1 of the present invention and the flat base plate of the epitaxial chip, tested by an ultraviolet light probe microscopy of 400 nm and 415 nm wavelength individually.

TABLE 3

| Wp | Flat (mW) | PSS (mW) | Increment |
|---|---|---|---|
| 400 | 74.10 | 130.24 | 75.8% |
| 401 | 77.27 | 138.38 | 79.1% |
| 402 | 80.23 | 145.87 | 81.8% |
| 403 | 82.96 | 152.71 | 84% |
| 404 | 85.51 | 158.92 | 85.9% |
| 405 | 87.82 | 164.47 | 87.3% |
| 406 | 89.93 | 169.38 | 88.4% |
| 407 | 91.81 | 173.65 | 89.1% |
| 408 | 93.49 | 177.27 | 89.6% |
| 409 | 94.95 | 180.25 | 89.8% |
| 410 | 96.20 | 182.58 | 89.8% |
| 411 | 97.23 | 184.27 | 89.5% |
| 412 | 98.05 | 185.31 | 89% |
| 413 | 98.65 | 185.70 | 88.2% |
| 414 | 99.04 | 185.46 | 87.3% |
| 415 | 99.22 | 184.56 | 86% |
|  |  | Ave. | 86.2873% |

In Table 3, "Wp" is represented for ultraviolet light wavelength, "Flat" is represented for the epitaxial chip with the flat base plate, and "PSS" is represented for the 40 mil epitaxial chips 1 of the present invention. In Table 3, it is understood that the epitaxial chips 1 of the present invention has the radiation flux Po about 86% greater than that of the flat base plate. Accordingly, both 13 mil of the small die and 40 mil of the large die of the present invention can increase the radiation flux Po of the epitaxial chip 1 and brightness of the white light LED.

Figure 7:
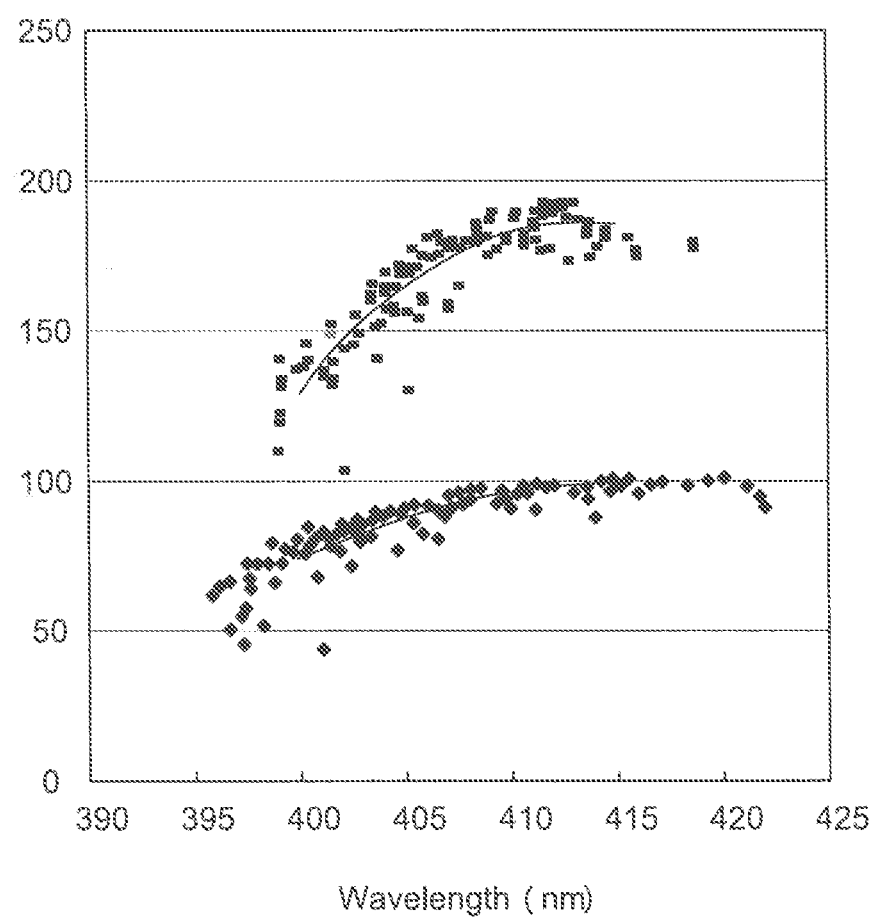
FIG. 7 is a schematic statistic diagram showing gain comparison of the radiation flux (Po) of a 40 mil epitaxial chip cut from a 2" sapphire wafer of the present invention.
Figure 8:
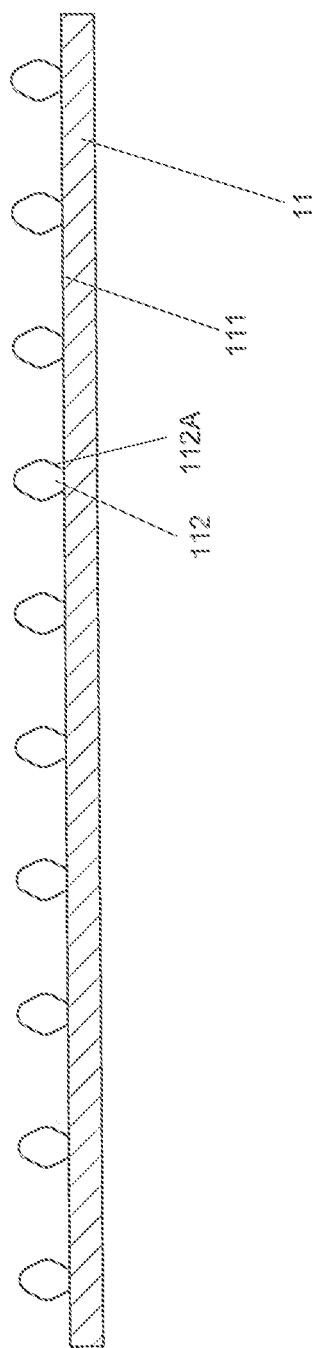
FIG. 8 is a schematic view showing a base plate of the present invention, wherein a bent segment is formed on the protrusion of the base plate.
Figure 9:
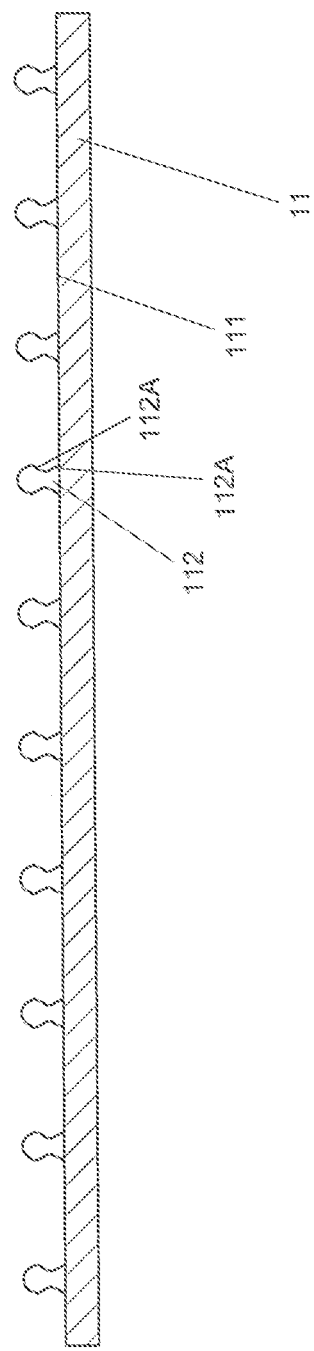
FIG. 9 is a schematic view showing a base plate of the present invention, wherein two bent segments is formed on the protrusion of the base plate.

FIGS. 7 and 8 show another preferred embodiment of the present invention. The outer surface of the protrusions 112 of the base plate 11 is formed with at least one bent segment 112A by laser engraving or other methods. Note that the process for manufacturing the bent segment 112A in the LED structure and the method for illumination thereof have been disclosed in the above embodiments, so that only section of the base plate 11 is illustrated in FIGS. 7 and 8. With the protrusions 112 formed with the bent segment 112A, irregular reflection of the ultraviolet light in the InGaN epitaxy layer (not shown in FIGs.) and light extraction efficiency can be enhanced.

What is claimed is:

1. A method for manufacturing a light-emitting diode base plate including a reflective surface, comprising the steps of:
   forming a plurality of protrusions on the light-emitting diode base plate; and
   forming top portions of the protrusions with curved surfaces, so that the protrusions have bottom widths of 2 to 4 micrometers and heights of 1.2 to 1.8 micrometers, and the adjacent protrusions have spaces of 0.6 to 3 micrometers.

2. The method for manufacturing the light-emitting diode base plate as claimed in claim 1, further providing a step of etching the protrusions on the light-emitting diode base plate.

3. The method for manufacturing the light-emitting diode base plate as claimed in claim 1, further providing a step of forming an outer surface of the protrusion with at least one bent segment.

4. The method for manufacturing the light-emitting diode base plate as claimed in claim 3, further providing a step of forming the bent segments of the protrusions by laser engraving.

5. A light-emitting diode base plate, comprising a reflective surface and a plurality of protrusions disposed on the reflective surface, the protrusions having top portions formed with curved surfaces, so that the protrusions have bottom widths of 2 to 4 micrometers and heights of 1.2 to 1.8 micrometers, and the adjacent protrusions have spaces of 0.6 to 3 micrometers.

6. The light-emitting diode base plate as claimed in claim 5, wherein the protrusion is formed as one of conical shape, pyramidal shape or hemispherical shape.

7. The light-emitting diode base plate as claimed in claim 6, wherein the protrusion has an outer surfaces formed with at least one bent segment.

8. The light-emitting diode base plate as claimed in claim 7, wherein the light-emitting diode base plate comprises a sapphire.

9. A white light light-emitting diode structure, comprising:
   an epitaxial chip comprising a base plate and an InGaN epitaxy layer, the base plate including a reflective surface and a plurality of protrusions disposed on the reflective surface, the InGaN epitaxy layer being coated on the reflective surface of the base plate, the protrusions having top portions formed with curved surfaces, so that the protrusions have bottom widths of 2 to 4 micrometers and heights of 1.2 to 1.8 micrometers, the adjacent protrusions have spaces of 0.6 to 3 micrometers, and the InGaN epitaxy layer coated on the reflective surface of the base plate emits ultraviolet of wavelength in the range of 380 to 410 nanometer when the InGaN epitaxy layer is electrified;
   a conductor comprising two lead wire bases respectively disposed with a lead wire, the epitaxial chip being bonded on either of the two lead wire bases of the conductor, the two lead wires being connected to the InGaN epitaxy layer of the epitaxial chip;
   a fluorescent compound covering on the InGaN epitaxy layer of the epitaxial chip, at least comprising zinc oxide and yttrium aluminum garnet; and
   a package body packaging the epitaxial chip, the conductor and the fluorescent compound, the two lead wire bases of the conductor penetrated through and disposed out of the package body.

10. The white light light-emitting diode structure as claimed in claim 9, wherein the protrusions of the base plate is formed as one of conical shape, pyramidal shape or hemispherical shape.

11. The white light light-emitting diode structure as claimed in claim 10, wherein the protrusion of the base plate has an outer surfaces formed with at least one bent segment.

12. The white light light-emitting diode structure as claimed in claim 11, wherein weight percentage of the zinc oxide in the fluorescent compound is 5% to 15%.

13. The white light light-emitting diode structure as claimed in claim 12, wherein the fluorescent compound is deposited on the InGaN epitaxy layer of the epitaxial chip.

14. The white light light-emitting diode structure as claimed in claim 12, wherein the fluorescent compound is mixed in the package body.

15. The white light light-emitting diode structure as claimed in claim 12, wherein the base plate of the epitaxial chip comprises a sapphire.

16. The white light light-emitting diode structure as claimed in claim 9, wherein the package body comprises epoxy resin.

* * * * *